(12) United States Patent
Chandrashekhar et al.

(10) Patent No.: US 12,433,058 B2
(45) Date of Patent: Sep. 30, 2025

(54) ELECTROMAGNETIC RADIATION TRANSMISSIVE POLYMER SUBSTRATES

(71) Applicant: Google LLC, Mountain View, CA (US)

(72) Inventors: Sandhya Chandrashekhar, Cupertino, CA (US); Samuel Wei Sheng, Saratoga, CA (US); Jean-Marie Bussat, San Jose, CA (US); Yoo Hsiu Yeh, Sunnyvale, CA (US); Khozema Jafferji, Oakland, CA (US)

(73) Assignee: Google LLC, Mountain View, CA (US)

( * ) Notice: Subject to any disclaimer, the term of this patent is extended or adjusted under 35 U.S.C. 154(b) by 455 days.

(21) Appl. No.: 18/160,100

(22) Filed: Jan. 26, 2023

(65) Prior Publication Data

US 2023/0170424 A1    Jun. 1, 2023

Related U.S. Application Data

(60) Provisional application No. 63/481,474, filed on Jan. 25, 2023.

(51) Int. Cl.
| | |
|---|---|
| *H01L 31/0216* | (2014.01) |
| *C09D 191/00* | (2006.01) |
| *H10F 71/00* | (2025.01) |
| *H10F 77/30* | (2025.01) |

(52) U.S. Cl.
CPC .......... *H10F 77/30* (2025.01); *C09D 191/00* (2013.01); *H10F 71/00* (2025.01)

(58) Field of Classification Search
CPC ........ H10F 77/30; H10F 71/00; C09D 191/00
See application file for complete search history.

(56) References Cited

U.S. PATENT DOCUMENTS

| | | | |
|---|---|---|---|
| 5,468,842 A * | 11/1995 | Howard, Jr. .......... | C08F 110/02 528/481 |
| 6,042,266 A | 3/2000 | Cheslock et al. | |
| 6,639,001 B1 | 10/2003 | Birnbrich et al. | |
| 2016/0113517 A1 | 4/2016 | Lee et al. | |

FOREIGN PATENT DOCUMENTS

CN          102785376        11/2012

OTHER PUBLICATIONS

Cerrada, et al., "A Significant Enhance of Impact Strength with Thermal Annealing in High Density Polyethylene", Jan. 2001, pp. 270-276.

Shide, et al., "Study on Infrared Transmittance of Si-Polymer Hybrid Structure Press Molded Using a Coupling Agent", Nov. 2019, pp. 817-824.

* cited by examiner

*Primary Examiner* — Nathan T Leong
(74) *Attorney, Agent, or Firm* — Colby Nipper PLLC

(57) ABSTRACT

This document describes electromagnetic radiation (EMR) transmissive polymer substrates and techniques for producing EMR transmissive polymer substrates by pre-treating polymer substrates with at least one lipid. In aspects, the EMR transmissive polymer substrates are infrared (IR) transmissive polymer substrates and the techniques described are for producing IR transmissive polymer substrates. In general, disclosed techniques include applying a coating of at least one lipid to at least one surface of a polymer substrate and then performing a heat-treatment process on the coated polymer substrate. The techniques may also include performing a cooling process on the polymer substrate after the heat-treatment process.

10 Claims, 3 Drawing Sheets

ELECTROMAGNETIC RADIATION TRANSMISSIVE POLYMER SUBSTRATES

This application claims priority under 35 U.S.C. § 119(e) to U.S. Provisional Patent Application 63/481,474, filed on Jan. 25, 2023, which is incorporated herein by reference in its entirety.

SUMMARY

This document describes electromagnetic radiation (EMR) transmissive polymer substrates and techniques for producing EMR transmissive polymer substrates by pre-treating at least one surface of a polymer substrate with at least one lipid. In aspects, the EMR transmissive polymer substrates are infrared (IR) transmissive polymer substrates and the techniques described are for producing IR transmissive polymer substrates.

The lipid pre-treatment of the at least one surface of the polymer substrate may make the polymer substrate more stable to variations in IR transmissivity resulting from finger touches, sebum, and potential food/oil spills on the polymer substrate over the life of a device (e.g., a computing device) incorporating such polymer substrate (e.g., in a sensor window). As a result of such a surface treatment, an increase in IR transmission levels through the polymer substrate in mid-IR and near-IR regions may occur. For applications that rely on measured infrared spectra, the surface treatment may help in increasing a measured input IR signal, thereby reducing the measurement error and guard banding for aging-related degradation of the polymer substrate.

In general, a first aspect of a described technique relates to a process of producing an improved IR transmissive polymer substrate. The process includes applying a coating of at least one lipid to at least one surface of the polymer substrate to pre-treat the polymer substrate and form a coated polymer substrate, performing a heat-treatment process on the coated polymer substrate to modify a molecular structure of the coated polymer substrate and increase transmissivity (or another optical property) of radiation (e.g., light, IR radiation) passing through the polymer substrate, and performing a cooling process on the polymer substrate.

This Summary is provided to introduce simplified concepts of EMR transmissive polymer substrates and techniques for producing EMR transmissive polymer substrates, which are further described below in the Detailed Description and illustrated in the Drawings. This Summary is intended neither to identify essential features of the claimed subject matter nor for use in determining the scope of the claimed subject matter.

BRIEF DESCRIPTION OF THE DRAWINGS

The details of one or more aspects of electromagnetic radiation (EMR) transmissive polymer substrates and techniques for producing EMR transmissive polymer substrates are described in this document with reference to the following Drawings, wherein use of same numbers in different instances may indicate similar features or components.

DETAILED DESCRIPTION

This document describes electromagnetic radiation (EMR) transmissive polymer substrates and techniques for producing EMR transmissive polymer substrates. In aspects, the EMR transmissive polymer substrates are infrared (IR) transmissive polymer substrates and the techniques described are for producing IR transmissive polymer substrates. The disclosed polymer substrates may improve EMR transmissivity and reliability of sensor windows fabricated from such polymer substrates. In aspects, the EMR transmissive polymer substrates are used in sensor windows in computing devices that include a light sensor (e.g., in computing devices with an IR sensor located behind a sensor window (sensor lens)).

Figure 1:
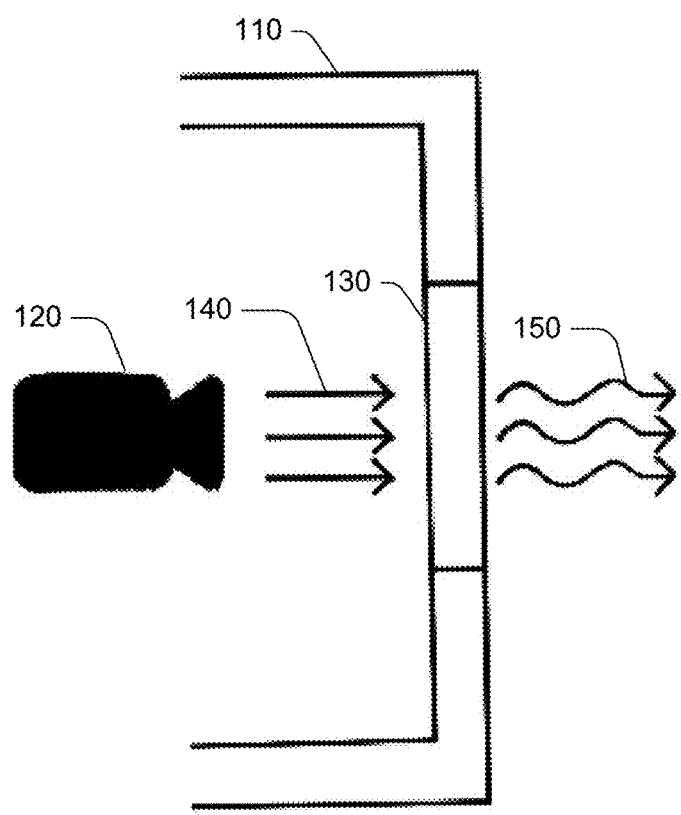
FIG. 1 is a side schematic view of a computing device.

The following discussion describes techniques that may be employed in the operating environment and various devices or systems in which components of the operating environment can be embodied. In the context of the present disclosure, reference is made to the operating environment by way of example only. FIG. 1 is a side schematic view of a computing device 100 (e.g., thermostat, thermometer, temporal artery thermometer, motion detector, camera, smart home device, smartphone, tablet computer, wearable device, passive IR sensor, scientific equipment) and elements of the computing device 100. The term "wearable device," as used in this disclosure, refers to any device that is capable of being worn at, on, or in proximity to a person's body (e.g., wrist, ankle, waist, chest, other body part) or prosthetic. Wearable devices include, but are not limited to, watches, bracelets, rings, necklaces, other jewelry, eyewear, goggles, footwear, gloves, headwear, and clothing.

The computing device 100 includes a housing 110, a sensor 120, and a sensor window 130 defined in an aperture of the housing 110. In aspects, the sensor 120 is a light sensor (e.g., a photodiode, a photoresistor, a phototransistor, a photovoltaic light sensor, and the like). For example, the sensor 120 may be a passive infrared sensor (PIR sensor) and the sensor window 130 may be a PIR window in the housing 110 of a computing device 100.

The sensor window 130 (e.g., a sensor lens) is made of a polymer substrate that is configured to permit an EMR signal (e.g., IR signal) emitted from the sensor 120 to pass therethrough. In aspects, the polymer substrate is formed of thermoplastic material (e.g., high-density polyethylene (HDPE), low-density polyethylene (LDPE), linear low-density polyethylene (LLDPE), polyethylene (PE), or the like). In other aspects, the polymer substrate is a polyolefin material.

The sensor 120 is configured to emit and/or receive electromagnetic radiation (e.g., infrared light). For example, the sensor 120 may be a motion sensor with an active infrared sensor that includes light-emitting diodes (LEDs) that emit an emitted signal 140 (e.g., infrared light) through the sensor window 130. The sensor 120 may detect a level of reflected light (e.g., reflected IR light) received back through the sensor window 130 (e.g., through the use of a photodetector). When the detected light level changes, this may indicate that an object in the environment of the computing device 100 has moved or may indicate another context. The detection of a change in the detected light level may be used to generate a signal and/or trigger an alert, alarm, and/or notification on the computing device 100.

The emitted signal 140 may be attenuated by passing through the sensor window 130, which results in an attenuated signal 150. The attenuated signal 150 may have decreased EMR transmissivity (e.g., lower IR transmittance in the 2 μm to 14 μm wavelength region). This attenuated signal 150 may cause an inaccurate sensor reading that decreases the accuracy of the sensor 120.

The disclosed EMR transmissive polymer substrates and techniques for producing EMR transmissive polymer substrates may improve EMR transmissivity (e.g., transmittance in the infrared region) and reliability of light sensor windows used in a computing device 100. For example, through the surface treatment of the polymer substrate of the sensor window 130, IR transmissivity in the range of 2 μm to 14 μm wavelength can be increased, which may improve the accuracy of the sensor 120.

Figure 2:
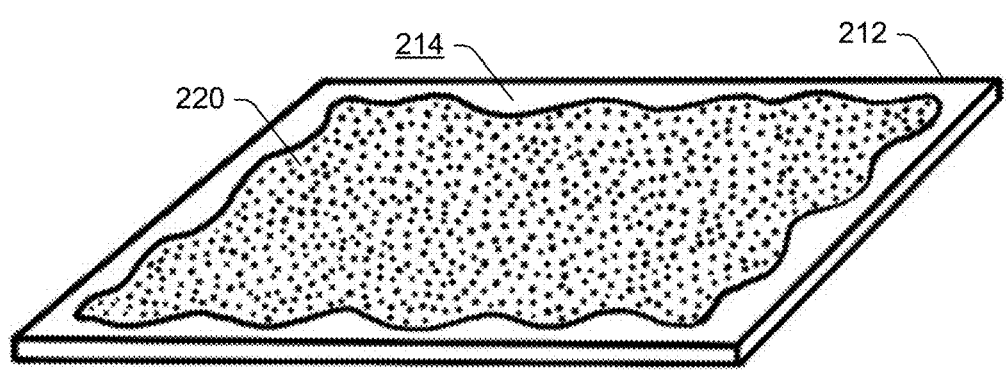
FIG. 2 is a perspective view of a coated polymer substrate.

FIG. 2 is a perspective view of a coated polymer substrate 200 that may be produced through use of the techniques disclosed herein. The coated polymer substrate 200 may include a body formed of a thermoplastic material (e.g., high-density polyethylene (HDPE), low-density polyethylene (LDPE), linear low-density polyethylene (LLDPE), polyethylene (PE)), a polyolefin material, or the like. In aspects, the polymer substrate material is lipid absorbent.

The coated polymer substrate 200 has a first side 212 with a surface 214 defined thereon. To form the coated polymer substrate 200, a surface coating 220 of at least one lipid is applied to at least the surface 214. The surface coating 220 may penetrate the surface 214 of the first side 212 and may saturate the surface 214 of the polymer substrate with the lipid(s). As used herein, the term "coating" refers to a continuous or discontinuous covering, in one or more layers, of one or more lipids that are applied, temporarily or permanently, to at least a portion of a surface of a substrate to impart a function to the substrate, such as modification of the transmissivity (or other optical property) of light (e.g., IR radiation) that passes through the substrate. The coating may be a thin film coating of the lipid(s). In aspects, the coating may result from compounding the lipid(s) into the polymer substrate.

The lipid may include at least one of an oil or a fatty acid. In aspects, the lipid is a mixture of at least one oil or fatty acid. The lipid may be one or more of a plant-derived lipid, an animal-derived lipid, or a microbial-derived lipid. When the lipid is or includes an oil, the oil may be selected from a group consisting of animal-based oils, plant-based oils, mineral-based oils, synthetic oils, and combinations thereof. Examples of plant-based oils include olive oil, corn oil, soybean oil, peanut oil, cottonseed oil, rapeseed oil, canola oil, safflower oil, sunflower oil, flax oil, palm oil, palm kernel oil, coconut oil, walnut oil, almond oil, sesame oil, and combinations thereof. Examples of mineral-based oils include mineral oil, petroleum jelly, paraffin oil, and liquid petroleum. When the lipid is or includes a fatty acid, the fatty acid may be oleic acid.

A short-duration heat-treatment process (e.g., anneal, bake, cure) is then performed on the coated polymer substrate 200 to form a heat-treated polymer substrate. The heat-treatment process may result in modification of a molecular structure (e.g., a chemical or physical structure change of the polymer chain) of the coated polymer substrate 200 that results in an increase in transmissivity for EMR radiation (e.g., IR radiation) that passes through the polymer substrate or another optical property of the polymer substrate. The heat-treatment process may drive the lipid(s) into the bulk matrix of the coated polymer substrate 200.

In aspects, the heat-treatment process may include moving the coated polymer substrate 200 through a space through which hot air circulates (e.g., an oven, belt furnace), applying heat using a hot plate or another heated surface, applying radiant heat from a radiant heat source (e.g., an infrared lamp), applying hot air from a hot air nozzle, and the like. The heat-treatment process may include heating the coated polymer substrate 200 at a treatment temperature less than a melting point of the coated polymer substrate 200. The treatment temperature may be between 40° C. and 80° C. In one example, the treatment temperature is 60° C.

The heat-treatment process may include heating the coated polymer substrate 200 at the treatment temperature for a processing time. The processing time may be any period or duration of time, including but not limited to one (1) hour, seventy-two (72) hours, and two (2) weeks.

In aspects, the heat-treatment process may be performed at any relative humidity, such as at a high relative humidity (e.g., a relative humidity of 90%). The heat-treatment process may be performed at a low atmospheric pressure, at a standard atmospheric pressure, or at a high atmospheric pressure.

A cooling process may then be performed on the treated polymer substrate. In an example, the cooling process includes cooling the treated polymer substrate to a temperature less than 20° C. (e.g., room temperature) over a time period (e.g., sixty (60) minutes). The cooling process may reduce internal stresses of the treated polymer substrate, which may prevent cracking and/or deformation of the material.

After or before the applying process, heating process, and/or cooling process, the polymer substrate can be shaped or formed into a sensor window (e.g., sensor window 130 of FIG. 1) of a computing device (e.g., computing device 100 of FIG. 1).

EXAMPLE PROCESSES

This section describes example processes, which may operate separately or together in whole or in part. In general, disclosed processes of producing EMR transmissive polymer substrates (e.g., IR transmissive polymer substrates) include applying a coating of a lipid to at least one surface of a polymer substrate and then performing a heat-treatment process on the coated polymer substrate. The processes may also include performance of a cooling process on the polymer substrate after the heat-treatment process.

Figure 3:
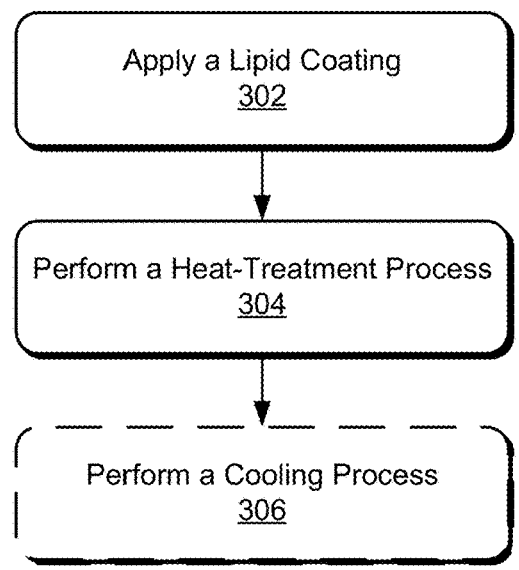
FIG. 3 illustrates an example process for producing EMR transmissive polymer substrates.

FIG. 3 illustrates an example process 300 for producing IR transmissive polymer substrates. The process is shown as a set of blocks that specify operations performed but are not necessarily limited to the order or combinations shown for performing the operations by the respective blocks. Further, any of one or more of the operations may be repeated, combined, reorganized, or linked to provide a wide array of additional and/or alternative processes. In portions of the following discussion, reference may be made to the example computing device 100 of FIG. 1 and/or the coated polymer substrate 200 of FIG. 2, references to which are made for example only.

A polymer substrate is provided, and at 302 a coating of at least one lipid is applied to the surface of the polymer substrate to form a coated polymer substrate (e.g., coated polymer substrate 200 of FIG. 2). At 304, a heat-treatment process (e.g., the heat-treatment process described with respect to the coated polymer substrate 200 of FIG. 2) is performed on the coated polymer substrate. Optionally, at 306, after the heat-treatment process, a cooling process (e.g., the cooling process described with respect to the coated polymer substrate 200 of FIG. 2) may be performed on the heat-treated coated polymer substrate.

CONCLUSION

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

Although concepts of electromagnetic radiation (EMR) transmissive polymer substrates and techniques for producing EMR transmissive polymer substrates by pre-treating polymer substrates with a lipid have been described in language specific to substrates and/or techniques, it is to be understood that the subject of the appended claims is not necessarily limited to the specific substrates and/or techniques described. Rather, the specific substrates and/or techniques are disclosed as example implementations of ways in which electromagnetic radiation (EMR) transmissive polymer substrates and techniques for producing EMR transmissive polymer substrates by pre-treating polymer substrates with a lipid may be implemented.

What is claimed is:

1. A process for producing an infrared transmissive polymer substrate for a computing device sensor window, the process comprising:
    applying a coating of at least one lipid to at least one surface of a polymer substrate to form a coated polymer substrate; and
    performing a heat-treatment process on the coated polymer substrate at a treatment temperature less than a melting point of the polymer substrate to modify a molecular structure of the coated polymer substrate and increase the transmissivity for infrared radiation passing through the coated polymer substrate.

2. The process of claim 1, further comprising:
    performing a cooling process on the coated polymer substrate.

3. The process of claim 2, wherein the cooling process further comprises:
    cooling the coated polymer substrate to a temperature less than 20° C.

4. The process of claim 1, wherein the polymer substrate comprises a thermoplastic material or a polyolefin material.

5. The process of claim 1, wherein the polymer substrate comprises high-density polyethylene, low-density polyethylene, linear low-density polyethylene, or polyethylene.

6. The process of claim 1, wherein the lipid comprises at least one of:
    an oil; or
    a fatty acid.

7. The process of claim 1, wherein the lipid comprises an oil and the oil is at least one of an animal-based oil, a plant-based oil, a mineral-based oil, or a synthetic oil.

8. The process of claim 1, wherein the lipid comprises a fatty acid and the fatty acid is oleic acid.

9. The process of claim 1, wherein the treatment temperature is between 40° C. and 80° C.

10. The process of claim 1, wherein the heat-treatment process is performed for a processing time of between one hour and two weeks.

* * * * *